(12) United States Patent
Kim et al.

(10) Patent No.: US 8,780,612 B2
(45) Date of Patent: Jul. 15, 2014

(54) RESISTIVE MEMORY DEVICE AND PROGRAMMING METHOD THEREOF

(75) Inventors: Youncheul Kim, San Jose, CA (US); Jeongsu Jeong, San Jose, CA (US); Yonggu Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 16 days.

(21) Appl. No.: 13/591,812

(22) Filed: Aug. 22, 2012

(65) Prior Publication Data

US 2014/0056054 A1 Feb. 27, 2014

(51) Int. Cl.
*G11C 11/00* (2006.01)
*G11C 13/00* (2006.01)

(52) U.S. Cl.
CPC .................................. *G11C 13/0069* (2013.01)
USPC ........................................... 365/148; 365/163

(58) Field of Classification Search
CPC ........... G11C 13/0069; G11C 13/0004; G11C 13/0007
USPC .................................................. 365/148, 163
See application file for complete search history.

(56) References Cited

U.S. PATENT DOCUMENTS

2010/0027326 A1* 2/2010 Kim et al. ...................... 365/163
2010/0290275 A1* 11/2010 Park ............................... 365/163

\* cited by examiner

*Primary Examiner* — Huan Hoang
(74) *Attorney, Agent, or Firm* — IP & T Group LLP

(57) ABSTRACT

A method for programming a resistive memory device includes: programming a resistive memory; generating a verification data based on comparison result of a voltage, which is generated from a current flowing through the resistive memory, and a verification reference voltage which is higher than a read reference voltage used for a normal read operation; and deciding whether to end a program operation based on the verification data.

7 Claims, 4 Drawing Sheets

RESISTIVE MEMORY DEVICE AND PROGRAMMING METHOD THEREOF

BACKGROUND

1. Field

Exemplary embodiments of the present invention relate to a resistive memory device, and more particularly, to a programming method of the resistive memory device.

2. Description of the Related Art

Generally, a data is recognized according to whether a fuse is cut by a laser or not in a resistive memory device. A fuse may be programmed in the stage of wafer. However, after the wafer is mounted on a package, it may be generally difficult to program the fuse.

An e-fuse is introduced and used to solve the problem. An e-fuse stores data by using a transistor which may change its electrical characteristic between a gate and a drain/source.

FIG. 1 is a schematic diagram of an e-fuse, which is formed of a transistor, operating as a resistor or a capacitor.

Referring to FIG. 1, the e-fuse is formed of a transistor T. A power source voltage is supplied to a gate G while a ground voltage is supplied to a drain/source D/S.

When a power source voltage of an ordinary level where the transistor T may operate is supplied to the gate G, the e-fuse can operate as a capacitor C. No current flows between the gate G and the drain/source D/S. However, when a high power source voltage, e.g., over-voltage where the transistor T may not normally operate, is supplied to the gate G, the gate oxide of the transistor T is destroyed to electrically short the gate G and the drain/source D/S, and then the e-fuse may operate as a resistor R. Current may flow between the gate G and the drain/source D/S. Based on the phenomenon, the data of an anti-fuse is recognized from the resistance value between the gate G and the drain/source D/S of the e-fuse. Herein, to recognize the data of the e-fuse, (1) the size of the transistor T has a large size to recognize the data without performing a sensing operation, or (2) an additional amplifier may be used to recognize the data of the e-fuse by sensing the current flowing through the transistor T having a small size. These two methods have limitation about integration degree, because the size of the transistor T constituting the e-fuse is required to be big, or each e-fuse has to be coupled with an amplifier for amplifying data.

FIG. 2 is a schematic diagram illustrating a memory device formed of an e-fuse, which is a resistive memory.

Referring to FIG. 2, the memory device includes a resistive memory M, a data line DL, a load 210, a sense amplifier 220, and a latch 230. Hereafter, an operation of programming the resistive memory M and an operation of reading data from the resistive memory M are described.

When the resistive memory M is programmed (or ruptured), a high voltage that can destroy a gate oxide of the gate G is supplied to the gate G of the resistive memory M. As a result, the resistive memory M operates as a resistor which has a relatively small resistance value, while a resistive memory M that may be not programmed operates as a capacitor which has a relatively great resistance value.

When the resistive memory M is read, a power source voltage of a level for a read operation is supplied to the gate G of the resistive memory M. As a result, a current path is formed from the resistive memory M to the data line DL and the load 210. Since the resistive memory M operates as a resistor when the resistive memory M is programmed, current flows through the load 210. Due to a voltage drop by the load 210, the level of a data voltage, which is a voltage of the data line DL, is increased. Since the resistive memory M operates as a capacitor when the resistive memory M may be not programmed, little current flows through the load 210. Therefore, the data voltage is in a low level near a ground level.

The sense amplifier 220 generates a data DATA by comparing the data voltage with a reference voltage VREF. The latch 230 latches the data DATA in response to a latch signal LAT_EN that is enabled after a predetermined time passes from a moment when the power source voltage is supplied to the gate G of the resistive memory M.

The gate oxide may be readily destroyed or hardly destroyed according to the characteristics of the resistive memory M. Therefore, after the resistive memory M is programmed, it is checked whether the resistive memory M is programmed normally by reading the data DATA, and when the resistive memory M may be not properly programmed, the resistive memory M is desirable to be programmed again.

SUMMARY

An embodiment of the present invention is directed to a method for reliably verifying whether a resistive memory device is programmed or not when the resistive memory device is programmed.

In accordance with an embodiment of the present invention, a method for programming a resistive memory device includes programming a resistive memory; generating a verification data based on a comparison result of a voltage, which is generated from a current flowing through the resistive memory, and a verification reference voltage which is higher than a read reference voltage used for a normal read operation; and deciding whether to end a program operation based on the verification data.

In accordance with another embodiment of the present invention, a method for programming a resistive memory device includes programming a resistive memory; generating a verification data by comparing a voltage, which is generated from a current flowing through the resistive memory, with a verification reference voltage; latching the verification data after a verification margin time passes from a moment when a current starts to flow through the resistive memory, wherein the verification margin time is shorter than a time required to latch a read data determined based on the current during a normal read operation; and deciding whether to end a program operation or not based on the latched verification data.

In accordance with another embodiment of the present invention, a resistive memory device includes: a resistive memory configured to receive an operation voltage during a read operation and a verification operation and receive a higher voltage than the operation voltage during a program operation; a data line configured to transfer a current flowing from the resistive memory; a load coupled with the data line; a reference voltage generator configured to generate a first reference voltage during a read operation and generate a second reference voltage which is higher than the first reference voltage during a verification operation; and a sense amplifier configured to generate a data based on a comparison result of a voltage of the data line and one of the first reference voltage and the second reference voltage.

In accordance with another embodiment of the present invention, a resistive memory device includes a resistive memory configured to receive an operation voltage during a read operation and a verification operation and receive a higher voltage than the operation voltage during a program operation; a data line configured to transfer a current flowing from the resistive memory; a load coupled with the data line; a reference voltage generator configured to generate a reference voltage; a sense amplifier configured to generate a data by comparing a voltage of the data line with the reference voltage that is generated in the reference voltage generator; a latch controller configured to enable a latch signal at a first moment during a read operation and a second moment which is earlier than the first moment during a verification operation; and a latch configured to latch a data generated in the sense amplifier in response to the latch signal.

In accordance with another embodiment of the present invention, a resistive memory device includes a memory array configured to include a plurality of memory cells each of which includes a resistive memory and a switch; a row control circuit configured to apply an operation voltage to memories of a row selected from the memory array during a read operation and a verification operation, apply a higher voltage than the operation voltage during a program operation, and electrically connect the memories of the selected row with column lines by turning on the switches of the selected row; a column control circuit configured to electrically connect a column line selected from the memory array with a data line; a load coupled with the data line; a reference voltage generator configured to generate a first reference voltage during a read operation and a second reference voltage which is higher than the first reference voltage during a verification operation; and a sense amplifier configured to generate a data based on a comparison result of a voltage of the data line and one of the first reference voltage and the second reference voltage.

In accordance with another embodiment of the present invention, a resistive memory device includes a memory array configured to include a plurality of memory cells each of which includes a resistive memory and a switch; a row control circuit configured to apply an operation voltage to memories of a row selected from the memory array during a read operation and a verification operation, apply a higher voltage than the operation voltage during a program operation, and electrically connect the memories of the selected row with column lines by turning on the switches of the selected row; a column control circuit configured to electrically connect a column line selected from the memory array with a data line; a load coupled with the data line; a reference voltage generator configured to generate a reference voltage; a sense amplifier configured to generate a data by comparing a voltage of the data line with the reference voltage that is generated in the reference voltage generator; a latch controller configured to enable a latch signal at a first moment during a read operation and at a second moment which is earlier than the first moment during a verification operation; and a latch configured to latch a data generated in the sense amplifier in response to the latch signal.

DETAILED DESCRIPTION

Figure 1:
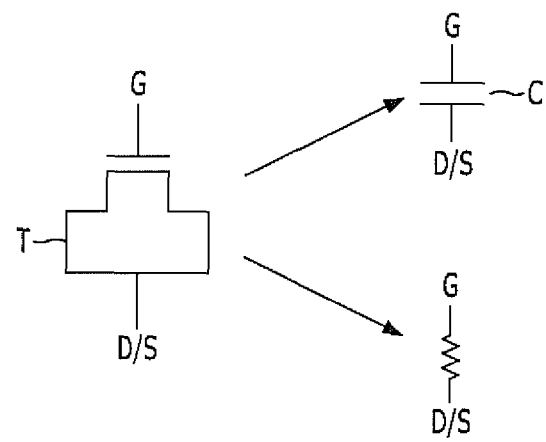
FIG. 1 is a schematic diagram of an e-fuse, which is formed of a transistor, operating as a resistor or a capacitor.
Figure 2:
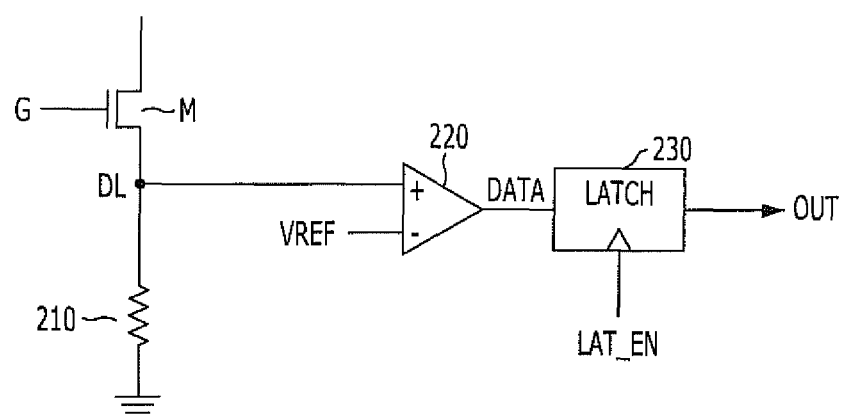
FIG. 2 is a schematic diagram illustrating a memory device formed of an e-fuse, which is a resistive memory.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
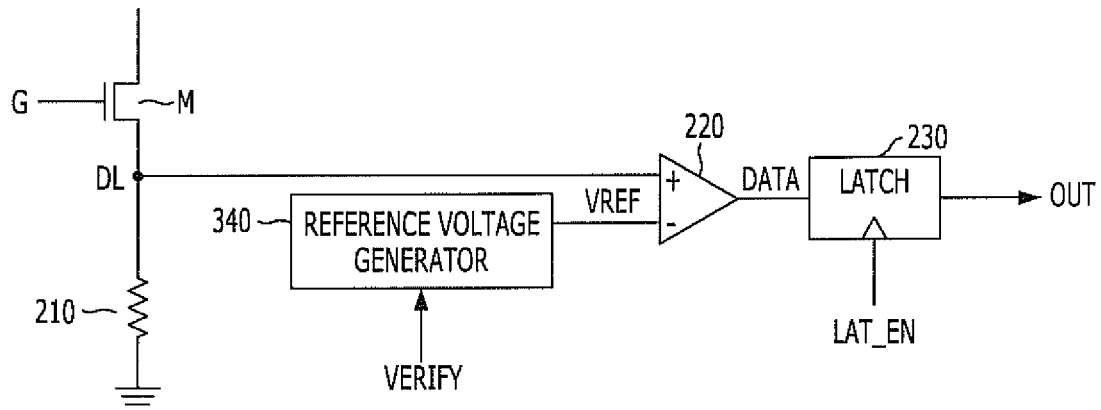
FIG. 3 is a schematic diagram illustrating a resistive memory device in accordance with an embodiment of the present invention.

FIG. 3 is a schematic diagram illustrating a resistive memory device in accordance with an embodiment of the present invention.

Referring to FIG. 3, the resistive memory device includes a resistive memory M, a data line DL, a load 210, a reference voltage generator 340, a sense amplifier 220, and a latch 230.

The reference voltage generator 340, which is added in this embodiment, generates different reference voltages for a verification operation and a normal read operation. The verification operation is for verifying whether the resistive memory device is programmed or not. When a verification signal VERIFY for informing that the currently performed operation is a verification operation is enabled, the reference voltage generator 340 increases the level of the reference voltage VREF higher than when the verification signal VERIFY is disabled. For example, when the level of the reference voltage VREF during a normal read operation is approximately 0.4V, the level of the reference voltage VREF during a verification operation is approximately 0.45V.

When the level of the reference voltage VREF is increased, it becomes more difficult for the sense amplifier 220 to recognize the data of the resistive memory M as a program data. Therefore, when the sense amplifier 220 recognizes the data of the resistive memory M as a program data even though the reference voltage VREF is increased, the possibility that the sense amplifier 220 erroneously recognizes the data of the resistive memory M during a normal read operation is decreased.

Based on the principle, the difference between the level of the reference voltage VREF, which is generated by the reference voltage generator 340 during a normal read operation, and the level of the reference voltage VREF, which is generated during a verification operation, functions as a margin of the memory device so that the memory device may operate more stably owing to the margin.

Figure 4:
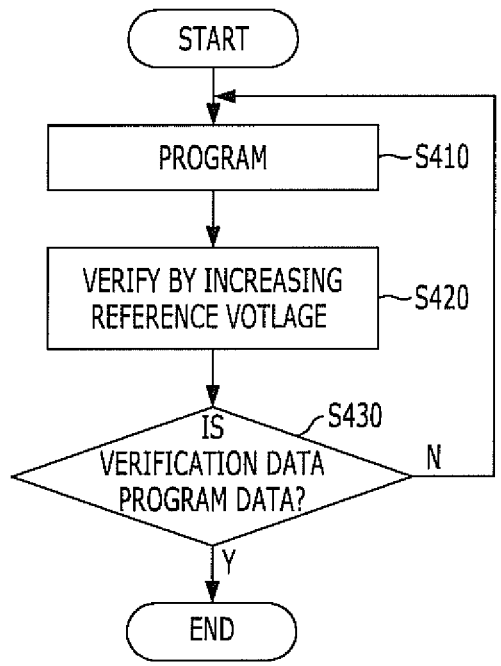
FIG. 4 is a flowchart describing a program operation of the resistive memory device shown in FIG. 3.

FIG. 4 is a flowchart describing a program operation of the resistive memory device shown in FIG. 3.

Referring to FIG. 4, the resistive memory M is programmed in step S410. The resistive memory M may be programmed by supplying a high voltage to the gate G of the resistive memory M. The high voltage is generated by pumping up the power source voltage.

In step S420, a verification operation is performed to check whether the resistive memory M is normally programmed or not. Herein, the level of the reference voltage VREF is generated to be higher than the level of the reference voltage VREF generated during the normal read operation. When the verification operation is performed, a voltage of an appropriate level to the read operation, which is generally the power source voltage, is supplied to the gate G of the resistive memory M, and a current path is formed from the resistive memory M to the data line DL and the load 210. When the resistive memory M is normally programmed, current flows through the load 210, and the voltage level of the data line DL, which is a data voltage, is increased due to a voltage drop occurring in the load 210. Therefore, the sense amplifier 220 outputs a data DATA of logic high level. The data DATA outputted from the sense amplifier 220 is latched in the latch 230.

In step S430, the data stored in the latch 230 is checked out, and when the data stored in the latch 230 is a logic high level, the program operation is ended. When the data stored in the latch 230 is a logic low level, which means that the data is not a program data, the processes of the steps S410 to S430 are performed again.

When the program operation is ended after going through the above-described processes, whether the resistive memory M is programmed or not is verified more strictly than when the normal read operation is performed. Therefore, the memory device may stably operate in the normal read operation. Herein, the process of the step S420 is performed the same in the normal read operation except that the reference voltage VREF is lower than that of the verification operation.

Figure 5:
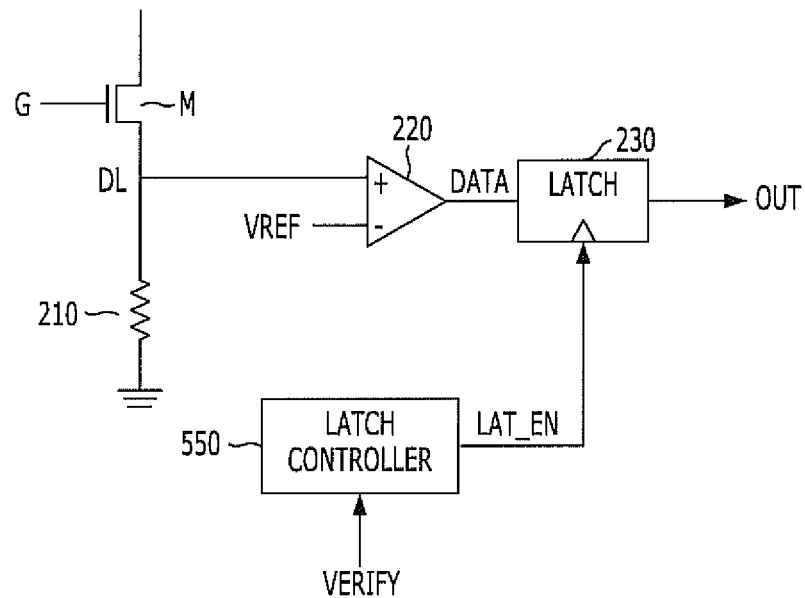
FIG. 5 is a schematic diagram illustrating a resistive memory device in accordance with another embodiment of the present invention.

FIG. 5 is a schematic diagram illustrating a resistive memory device in accordance with another embodiment of the present invention.

Referring to FIG. 5, the resistive memory device includes a resistive memory M, a data line DL, a load 210, a sense amplifier 220, a latch controller 550, and a latch 230.

The latch controller 550, which is added in this embodiment of the present invention, controls a latch signal LAT_EN to have different enable moments for a verification operation and a normal read operation. When a verification signal VERIFY for informing that the currently performed operation is a verification operation is enabled, the latch controller 550 enables the latch signal LAT_EN earlier than when the verification signal VERIFY is disabled. For example, if the latch signal LAT_EN is enabled after an 'A' time passes from a moment when an operation voltage is supplied to the gate G of the resistive memory M during a normal read operation, the latch signal LAT_EN is enabled after an 'A-α' time passes from a moment when an operation voltage is supplied to the gate G of the resistive memory M during a verification operation.

A predetermined time has to pass from a moment when an operation voltage is supplied to the gate G of the resistive memory M in order for the sense amplifier 220 to correctly recognize the data of the resistive memory M. This is because it takes the predetermined time until the voltage level of the data line DL is increased by the current flowing from the resistive memory M. Therefore, when the latch 230 advances the time for latching the output data DATA of the sense amplifier 220 during the verification operation earlier, the verification is performed more strict circumstances than when a normal read operation is performed.

Based on the principle, the difference between a moment when the latch controller 550 enables the latch signal LAT_EN during a normal read operation and a moment when the latch controller 550 enables the latch signal LAT_EN during a verification operation functions as margin of the memory device. The memory device may operate more stably.

Figure 6:
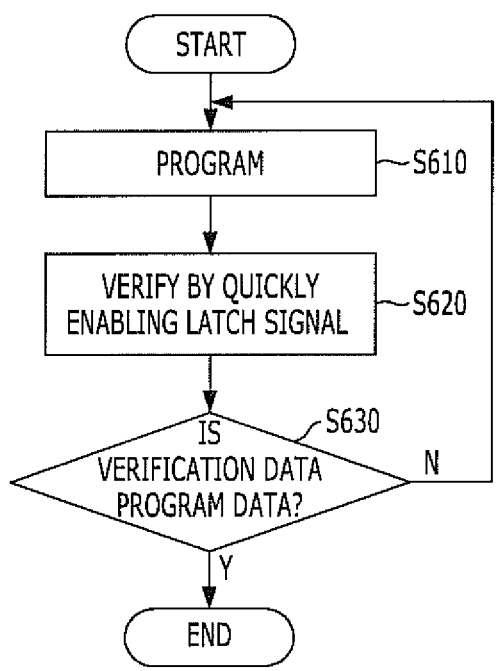
FIG. 6 is a flowchart describing a program operation of the resistive memory device shown in FIG. 5.

FIG. 6 is a flowchart describing a program operation of the resistive memory device shown in FIG. 5.

Referring to FIG. 6, the resistive memory M is programmed in step S610. The resistive memory M may be programmed by applying a high voltage to the gate G of the resistive memory M in step S610.

In step S620, a verification operation for checking whether the resistive memory M is programmed or not is performed. A voltage of an appropriate level for a read operation is supplied to the gate G of the resistive memory M. A current path is formed from the resistive memory M to the data line DL and the load 210. The voltage level of the data line DL is increased due to the current flowing through the load 210. The voltage level of the data line DL is compared with the reference voltage VREF in the sense amplifier 220. When the latch controller 550 enables the latch signal LAT_EN at an earlier moment than an enable moment of a normal operation, the latch 230 latches the data DATA of the sense amplifier 220. Herein, when the resistive memory M is normally programmed, a data of logic high level is stored in the latch 230. Otherwise, a data of logic low level is stored in the latch 230.

In step S630, the data stored in the latch 230 is checked out, and when the data stored in the latch 230 is a logic high level, the program operation is ended. When the data stored in the latch 230 is a logic low level, which means that the data is not a program data, the processes of the steps S610 to S630 are performed again.

When the program operation is ended after going through the above-described processes, whether the resistive memory M is programmed or not is verified more strictly than when the normal read operation is performed. Therefore, the memory device may stably operate in the normal read operation. Herein, the process of the step S620 is performed the same in the normal read operation except that the latch signal LAT_EN is enabled at a later moment than the enable moment of the verification operation.

The embodiment shown in FIGS. 3 and 4 describes the scheme for securing margin during a verification operation by controlling the voltage level of the reference voltage VREF in the reference voltage generator 340, and the embodiment shown in FIGS. 5 and 6 describes the scheme for securing margin during a verification operation by controlling a latch moment in the latch controller 550. The two schemes may be applied independently from each other, or they may be applied at the same time. For example, a resistive memory device may include both of the reference voltage generator 340 and the latch controller 550.

Figure 7:
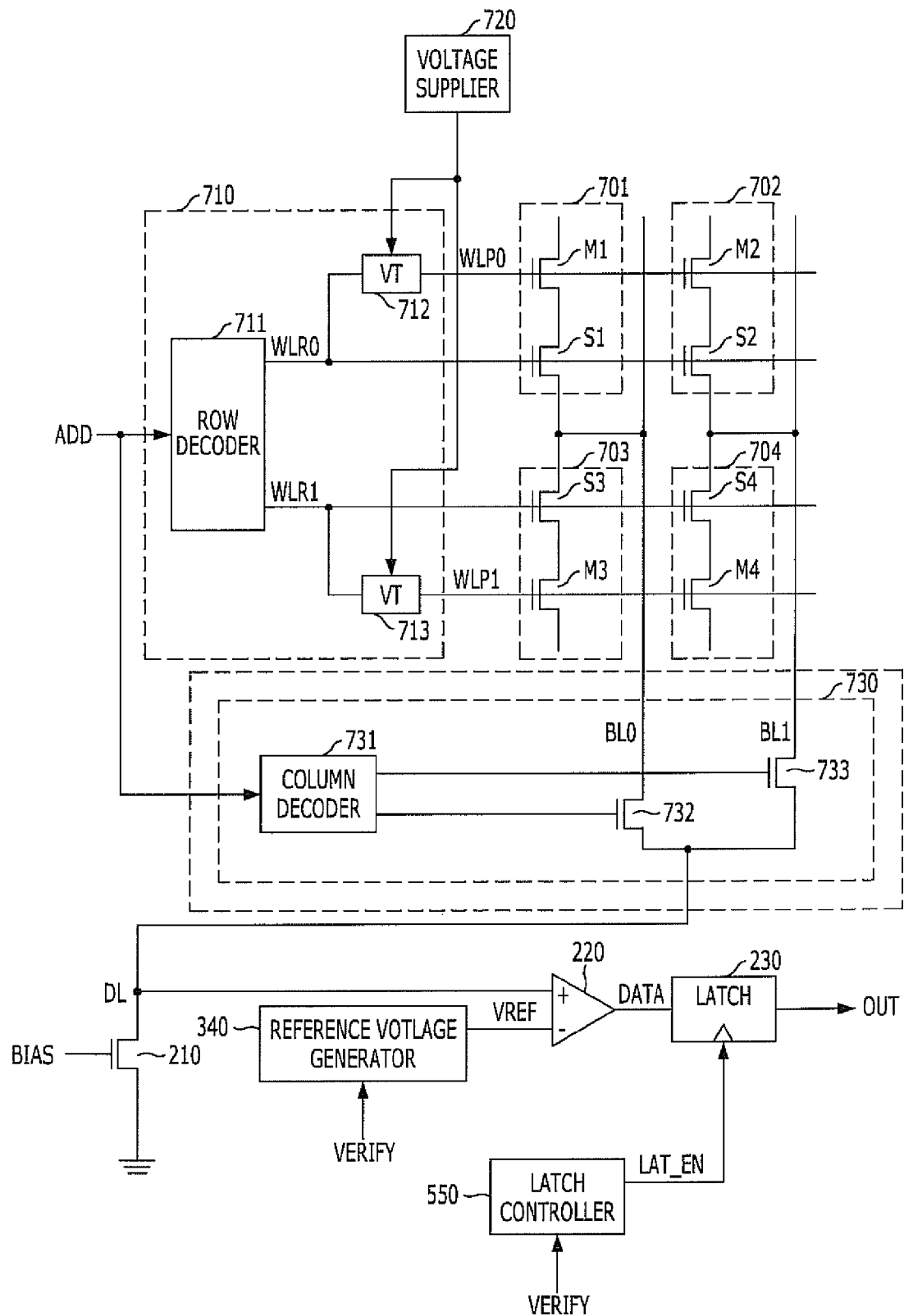
FIG. 7 illustrates a scheme of the present invention being applied to a resistive memory device including a resistive memory array.

FIG. 7 illustrates a scheme of the present invention being applied to a resistive memory device including a resistive memory array.

Referring to FIG. 7, the resistive memory device includes a cell array having a plurality of memory cells 701, 702, 703 and 704, a row control circuit 710, a voltage supplier 720, a column control circuit 730, a load 210, a reference voltage generator 340, a sense amplifier 220, a latch controller 550, and a latch 230.

The memory cells 701, 702, 703 and 704 include resistive memories M1, M2, M3 and M4 and switches S1, S2, S3 and S4, respectively. The resistive memories M1, M2, M3 and M4 have the characteristics of resistors or capacitors according to whether they are ruptured or not. The switches S1, S2, S3 and S4 electrically connect the resistive memories M1, M2, M3 and M4 to column lines BL0 and BL1 under the control of row lines WLR0 and WLR1.

The row control circuit 710 includes a row decoder 711 and a plurality of voltage converters 712 and 713. The row decoder 711 enables a selected line among the row lines WLR0 and WLR1 to a logic high level by decoding an address ADD and turns on a switch of the selected row line. The voltage converters 712 and 713 drive the voltages of program/read lines WLP0 and WLP1 to a logic low level when the row lines WLR0 and WLR1 inputted thereto are disabled. When the row lines WLR0 and WLR1 inputted thereto are enabled, the voltage converters 712 and 713 receive a voltage P/R BIAS from the voltage supplier 720 and supply the received voltage P/R BIAS to the program/read lines WLP0 and WLP1.

The voltage supplier 720 provides the voltage converters 712 and 713 with a high voltage to destroy the gate oxide of the e-fuses M1, M2, M3 and M4 during a program operation where the fuses are ruptured. During a read operation and a verification operation, the voltage supplier 720 provides the voltage converters 712 and 713 with a voltage of a normal operational level for a read operation. Herein, the high voltage is generated by pumping up the power source voltage.

The column control circuit 730 includes a column decoder 731 and switches 732 and 733. The column decoder 731 controls the switches 732 and 733 to couple a selected column line among the column lines BL0 and BL1 with a data line by decoding the address ADD.

The load 210 includes a transistor that operates by receiving a bias voltage BIAS. The load 210 serves as a type of a current limiter. The function of the load 210 may be the same as that of FIG. 3 and that of FIG. 5. The reference voltage generator 340 generates different reference voltages VREF for a verification operation, which is a kind of read operation to check whether a resistive memory is programmed or not, and a normal read operation. When a verification signal VERIFY for informing that the currently performed operation is a verification operation is enabled, the reference voltage generator 340 increases the level of the reference voltage VREF higher than that in a case when the verification signal VERIFY is disabled. The sense amplifier 220 generates a data DATA by comparing the voltage level of the data line DL and the voltage level of the reference voltage VREF. The latch controller 550 performs a control to enable the latch signal LAT_EN at different moments for a verification operation and a normal read operation. When the verification signal VERIFY for informing that the currently performed operation is a verification operation is enabled, the latch controller 550 enables the latch signal LAT_EN at an earlier moment than when the verification signal VERIFY is disabled. The latch 230 latches the data DATA that is outputted from the sense amplifier 220 in response to the latch signal LAT_EN.

In the embodiment of FIG. 7, the resistive memories M1, M2, M3 and M4 are disposed in the form of an array, and the embodiment of FIG. 7 is the same as the embodiments of FIGS. 3 and 5, except that a program operation, a verification operation, and a read operation are performed only on the resistive memory that is selected based on the address ADD. Therefore, further description on it is omitted herein. Meanwhile, U.S. Pat. No. 7,269,047 discloses a typical structure of a resistive memory device including an e-fuse array.

According to an embodiment of the present invention, the level of the reference voltage that becomes a standard for recognizing data is changed, or latch timing of data is changed in the course of figuring out whether a program operation is normally performed on a resistive memory or not. Therefore, the resistive memory may operate with sufficient margin when the resistive memory device normally performs a read operation.

While the present invention has been described with respect to the specific embodiments, it will be apparent to those skilled in the art that various changes and modifications may be made without departing from the spirit and scope of the invention as defined in the following claims.

What is claimed is:

1. A method for programming a resistive memory device, comprising:
    programming a resistive memory element;
    generating a verification data by comparing a voltage, which is generated from a current flowing through the resistive memory element, with a verification reference voltage;
    latching the verification data after a verification margin time passes from a moment when a current starts to flow through the resistive memory element, wherein the verification margin time is shorter than a time required to latch a read data determined based on the current during a normal read operation; and
    deciding whether to end a program operation or not based on the latched verification data.

2. The method of claim 1, wherein the verification reference voltage is the same as a read reference voltage during a normal read operation.

3. The method of claim 1, wherein the verification reference voltage is lower than a read reference voltage during a normal read operation.

4. A resistive memory device, comprising:
    a resistive memory configured to receive an operation voltage during a read operation and a verification operation and receive a higher voltage than the operation voltage during a program operation;
    a data line configured to transfer a current flowing from the resistive memory;
    a load coupled with the data line;
    a reference voltage generator configured to generate a first reference voltage during the read operation and generate a second reference voltage which is higher than the first reference voltage during the verification operation;
    a sense amplifier configured to generate a data based on a comparison result of a voltage of the data line and one of the first reference voltage and the second reference voltage;
    a latch controller configured to enable a latch signal at a first moment during the read operation and enable the latch signal at a second moment which is earlier than the first moment during the verification operation; and
    a latch configured to latch a data generated in the sense amplifier in response to the latch signal.

5. A resistive memory device, comprising:
    a resistive memory element configured to receive an operation voltage during a read operation and a verification operation and receive a higher voltage than the operation voltage during a program operation;
    a data line configured to transfer a current flowing from the resistive memory element;
    a load coupled with the data line;
    a reference voltage generator configured to generate a reference voltage;
    a sense amplifier configured to generate a data by comparing a voltage of the data line with the reference voltage that is generated in the reference voltage generator;
    a latch controller configured to enable a latch signal at a first moment during the read operation and a second moment which is earlier than the first moment during the verification operation; and
    a latch configured to latch a data generated in the sense amplifier in response to the latch signal.

6. A resistive memory device, comprising:
    a memory array configured to include a plurality of memory cells each of which includes a resistive memory element and a switch;

a row control circuit configured to apply an operation voltage to memories of a row selected from the memory array during a read operation and a verification operation, apply a higher voltage than the operation voltage during a program operation, and electrically connect the memories of the selected row with column lines by turning on switches of the selected row;

a column control circuit configured to electrically connect a column line selected from the memory array with a data line;

a load coupled with the data line;

a reference voltage generator configured to generate a first reference voltage during the read operation and a second reference voltage which is higher than the first reference voltage during the verification operation;

a sense amplifier configured to generate a data based on a comparison result of a voltage of the data line and one of the first reference voltage and the second reference voltage;

a latch controller configured to enable a latch signal at a first moment during the read operation and enable the latch signal at a second moment which is earlier than the first moment during the verification operation: and a latch configured to latch a data generated in the sense amplifier in response to the latch signal.

7. A resistive memory device, comprising:

a memory array configured to include a plurality of memory cells each of which includes a resistive memory element and a switch;

a row control circuit configured to apply an operation voltage to memories of a row selected from the memory array during a read operation and a verification operation, apply a higher voltage than the operation voltage during a program operation, and electrically connect the memories of the selected row with column lines by turning on switches of the selected row;

a column control circuit configured to electrically connect a column line selected from the memory array with a data line;

a load coupled with the data line;

a reference voltage generator configured to generate a reference voltage;

a sense amplifier configured to generate a data by comparing a voltage of the data line with the reference voltage that is generated in the reference voltage generator;

a latch controller configured to enable a latch signal at a first moment during the read operation and at a second moment which is earlier than the first moment during the verification operation; and a latch configured to latch a data generated in the sense amplifier in response to the latch signal.

\* \* \* \* \*